United States Patent [19]

Kikkawa et al.

[11] Patent Number: 5,569,953
[45] Date of Patent: Oct. 29, 1996

[54] SEMICONDUCTOR DEVICE HAVING AN ISOLATION REGION ENRICHED IN OXYGEN

[75] Inventors: Toshihide Kikkawa; Tatsuya Ohori, both of Kawasaki, Japan

[73] Assignee: Fujitsu Limited, Japan

[21] Appl. No.: 449,113

[22] Filed: May 24, 1995

Related U.S. Application Data

[63] Continuation of Ser. No. 328,396, Oct. 24, 1994, Pat. No. 5,480,833, which is a continuation of Ser. No. 945,632, Oct. 19, 1992, abandoned.

[30] Foreign Application Priority Data

Feb. 19, 1991 [JP] Japan ........................... 3-24319

[51] Int. Cl.$^6$ ............... H01L 29/207; H01L 29/227; H01L 31/0304
[52] U.S. Cl. ................ 257/607; 257/609; 257/610; 257/612
[58] Field of Search ........................ 257/607, 610, 257/609, 612, 12, 62

[56] References Cited

U.S. PATENT DOCUMENTS

| | | | |
|---|---|---|---|
| 4,160,261 | 7/1979 | Casey, Jr. et al. | 257/192 |
| 4,253,887 | 3/1981 | Jolly | 148/175 |
| 4,632,710 | 12/1986 | Van Rees | 257/609 |
| 5,098,857 | 3/1992 | Kuech et al. | 437/107 |
| 5,223,724 | 6/1993 | Green, Jr. | 257/194 |

FOREIGN PATENT DOCUMENTS

| | | |
|---|---|---|
| 0180457 | 5/1986 | European Pat. Off. . |
| 61-075531 | 4/1986 | Japan . |
| 63-127530 | 5/1988 | Japan . |
| 1220432 | 9/1989 | Japan . |

OTHER PUBLICATIONS

Musolf et al., "Substituted Arsines AS As Sources in Mombe", *Journal of Crystal Growth*, vol. 105, No. 1/4, Oct. 1, 1990, Amsterdam, NL, pp. 271–274.

Hiruma et al., "Improved Performance of Submicrometer-Gate GaAs MESFET'S with an $Al_{0.3}Ga_{0.7}$ as Buffer Layer Grown by Metal Organic Vapor Phase Epitaxy", *IEEE Transactions on Electron Devices*, vol. 36, No. 2, Feb., 1989, New York, US, pp. 314–318.

Asbeck et al., "GaAs/(Ga,Al) as Heterojunction Bipolar Transistors with Buried Oxygen–Implanted Isolation Layers", *IEEE Electron Device Letters*, vol. EDL-5, No. 8, Aug., 1984, New York, US, pp. 310–312.

Hida et al. "High-Speed and Large Noise Margin Tolerance E/D Logic Gates with LDD Structure DMT's Fabricated Using Selective RIE Technology", *IEEE Transactions on Electron Devices*, vol. 36, No. 10, Oct., 1989 New York, US, pp. 2223–2230.

Kastalsky et al., "A Field–Effect Transistor with a Negative Differential Resistance", *IEEE Electron Device Letters*, vol. EDL-5, No. 2, Feb. 2, 1984, New York, US, pp. 57–60.

*Primary Examiner*—Robert P. Limanek
*Assistant Examiner*—David B. Hardy
*Attorney, Agent, or Firm*—Greer, Burns & Crain, Ltd.

[57] ABSTRACT

A method for growing an epitaxial layer of a group III–V compound semiconductor material that contains oxygen comprises the steps of supplying molecules of an organic compound that contains a group V element and oxygen in the molecule, and decomposing the molecules of the organic compound to release the group V element and oxygen.

3 Claims, 11 Drawing Sheets

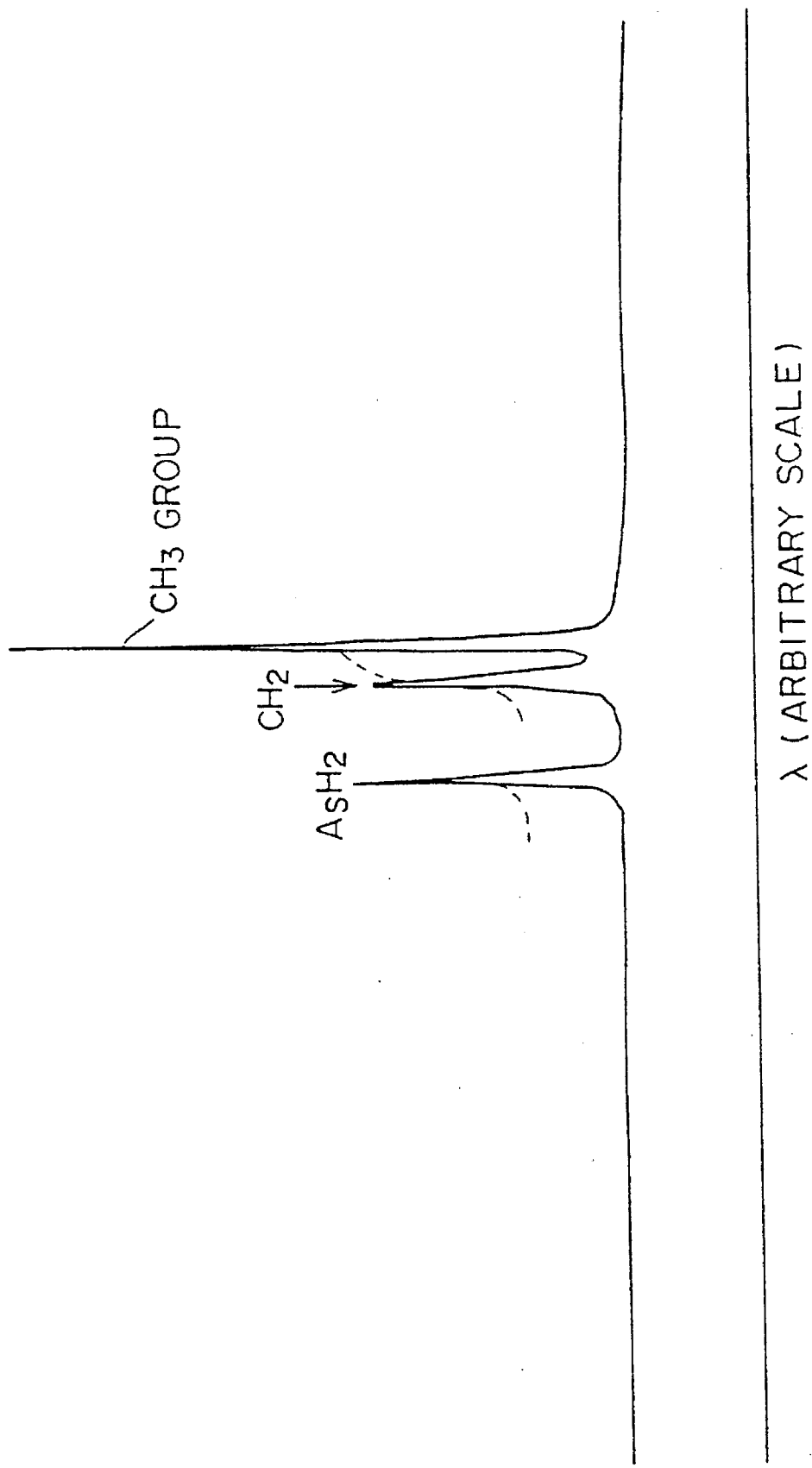

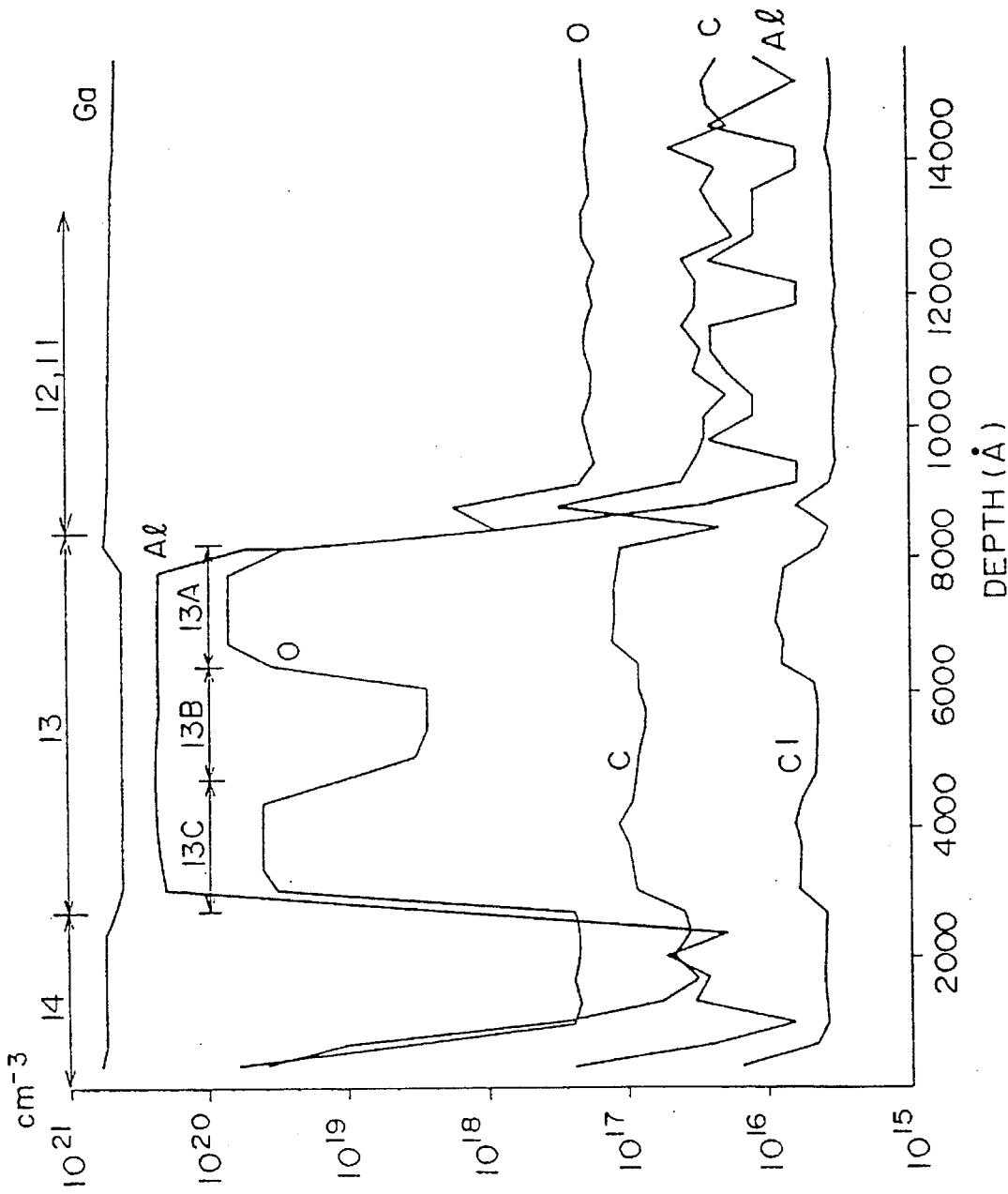

SEMICONDUCTOR DEVICE HAVING AN ISOLATION REGION ENRICHED IN OXYGEN

This is a continuation of application Ser. No. 08/328,396, filed Oct. 24, 1994, now U.S. Pat. No. 5,480,833, which is a continuation of Ser. No. 07/945,632 filed Oct. 19, 1992, now abandoned.

TECHNICAL FIELD

The present invention generally relates to semiconductor devices and more particularly to the fabrication of a compound semiconductor device that includes a layer of group III–V compound semiconductor material.

In the integrated circuit of semiconductor devices, it is essential to achieve a device isolation between adjacent devices. In the silicon devices, such an isolation can be achieved relatively easily by forming a film of silicon oxide. In the integrated circuit of semiconductor devices that use the group III–V compound semiconductor material for the essential part of the device, the device isolation raises a problem as the formation of the device isolation region by the oxidation process is generally not possible in such a device.

In order to achieve the effective device isolation in the group III–V semiconductor devices, it has been practiced to incorporate the so-called deep impurity elements into the semiconductor layer. When such deep impurity elements are incorporated, a pinning of the Fermi level occurs generally at the center of the forbidden band and the semiconductor material shows an increased resistivity.

Conventionally, the foregoing incorporation of the deep impurity elements has been achieved by using the ion implantation technique. In this technique, the elements such as oxygen or chromium are introduced into the semiconductor layer in correspondence to the region located between adjacent devices to form an isolation region that extends from the surface of the device toward the substrate.

BACKGROUND ART

FIG. 1 shows an example of the conventional device that employs such a device isolation.

Referring to FIG. 1, the device is a typical HEMT and includes a channel layer 3 of undoped GaAs and an electron supplying layer 5 of n-type AlGaAs that is provided on the channel layer 3 with an undoped spacer layer of AlGaAs interposed therebetween. Further, a cap layer 6 of n-type GaAs is provided on the electron supplying layer 5, and another cap layer 7 that contains layers of n-type AlGaAs and n-type GaAs is provided further on the cap layer 7. On the cap layer 7, a number of gate electrodes 8A, 8B, . . . , are provided in correspondence to a number of devices formed on the substrate.

In order to isolate the individual devices, the device of FIG. 1 uses an isolation region 9 that is formed in correspondence to the boundary between adjacent devices such that the region 9 extends from the surface of the layer 9 toward the substrate 1, passing through the layers 3–7. Typically, the region 9 is formed by incorporating oxygen or chromium ions by an ion implantation process and has an increased resistivity due to the foregoing pinning of the Fermi level. Thereby, the passage of the carriers from one device to another device is prevented.

Further, the foregoing layers 3–7 forming the active part of the device are formed on a semi-insulating GaAs substrate 1 that is covered with a buffer layer 2 such that the buffer layer 2 isolates the active part of the device from various adversary surface states or defects that are formed on the surface of the substrate 1. Typically, the buffer layer 2 is formed of an undoped AlGaAs and has a large resistivity. Thereby, each device is laterally isolated by the device isolation region 9 and vertically by the buffer layer 2, and the penetration of the carriers from one device to an adjacent device is prevented.

In such a conventional isolation structure, there exists a problem in that, although the penetration of the carriers from one device to the adjacent device can be minimized, the shielding of the electric field between the devices cannot be achieved successfully. It should be noted that the high purity buffer layer 2 lacks electric charges therein and passes the line of electric force and hence the electric field freely. Thereby, the electric field of one device penetrates into the region of the adjacent device and the operational characteristic of the device such as the threshold voltage tends to be influenced by the state of the adjacent device. In other words, the conventional device of FIG. 1 cannot eliminate the so-called side gate effect satisfactorily. It will be easily understood that the side gate effect becomes conspicuous with increasing integration density and decreasing separation between the devices.

In order to eliminate the foregoing problem, there is a proposal to form the buffer layer such that the buffer layer includes electric charges.

FIG. 2 shows a conventional process for achieving such an elimination of the side gate effect.

Referring to the drawing showing the case for growing a device on a silicon substrate 1A, a first buffer layer 2C of semi-insulating GaAs layer is provided on the substrate 1A for achieving a lattice matching, and a semi-insulating second buffer layer 2A of AlGaAs is grown on the first buffer layer 2C such that the buffer layer 2A contains oxygen ions therein. As a result of the electric charges incorporated in the layer 2A in the form of oxygen ions, the buffer layer 2A can now interrupt the electric field penetrating from the adjacent devices and the side gate effect is effectively eliminated. Further, the oxygen ions form the deep impurity level in the AlGaAs crystal and the buffer layer 2A shows a high resistivity as a result of the pinning of the Fermi level similarly to the device isolation region 9. On the first buffer layer 2A, the layers 3–7 are grown similarly to the structure shown in FIG. 1.

In the structure of FIG. 2, the buffer layer 2A has to be grown under the existence of oxygen. For example, the buffer layer 2A may be grown by admixing small amount of oxygen or water vapor into the organic source of Al, Ga and As. However, oxygen is a chemically active species and the oxygen molecules thus introduced easily cause reaction with the wall of the reaction vessel or piping systems. Once absorbed, the oxygen molecules tend to stick on the vessel wall even after repeated flushing, and causes a contamination of the essential part of the device such as the channel layer 3. In order to avoid this problem, one may use a different epitaxial apparatuses for fabricating the semiconductor device such that the essential part of the device is grown in an apparatus that is different from the apparatus used for growing the buffer layer 2A. However, the use of such separate apparatuses inevitably necessitates a transportation step of taking out the half product from the reaction vessel of the first apparatus and mount the same on the reaction vessel of the second apparatus for further epitaxial process. During the transportation, it will be easily understood that the surface of the buffer layer 2A may be contaminated. In the device such as HEMT, such a contamination of the buffer layer 2A is unacceptable, as the channel layer 3 that forms the most critical part of the device is grown directly on the buffer layer 2A.

In order to eliminate the foregoing problem of contamination and to obtain a buffer layer of AlGaAs that contains oxygen ions as the impurity, there is a proposal in the Japanese Laid-open Patent Application No. 1-220432 to use an organic molecule that contains oxygen for the source of the group III element during the growth of the buffer layer. According to this proposal, an organic source such as trimethoxy gallium or trimethoxy aluminum is used for the source of oxygen and simultaneously for the source of the group III element. The organic source thus supplied decomposes in the reaction vessel in the vicinity of the substrate and release the group III element and oxygen. The oxygen atoms thus released in turn are combined immediately with Al atoms that are released also in the vicinity of the substrate because of the large affinity between aluminum and oxygen, and Al and O are deposited on the surface of the substrate without causing substantial contamination of the reaction vessel. By supplying oxygen in the form of stable organic molecules, one can avoid the contamination of the piping system as well.

In this conventional process, however, there arises a problem in that one cannot supply sufficient amount of oxygen into the reaction vessel and hence into the buffer layer. It should be noted that the flowrate of the organic source of the group III element determines the growth rate as well as the composition of the epitaxial layer and has to be controlled precisely. Generally, the flowrate of the organic source of the group III elements is substantially smaller than the flowrate of the organic source of the group V element. Thereby, the concentration of the oxygen in the reaction vessel after the decomposition becomes inevitably low. Therefore, this process does not provide the buffer layer having the desired device isolation effect.

DISCLOSURE OF THE INVENTION

Accordingly, it is a general object of the present invention to provide a novel and useful process for fabricating a semiconductor device, wherein the foregoing problems are eliminated.

Another and more specific object of the present invention is to provide a process for fabricating a semiconductor device having a semi-insulating semiconductor layer that contains oxygen ions with a high concentration level.

Another and more specific object of the present invention is to provide a process for growing an epitaxial layer of a group III–V compound semiconductor material that contains oxygen ions therein by supplying organic molecules of the group V element as a source gas, wherein the organic molecule of the source gas contains oxygen in the structure of the molecule. According to the present invention, one can introduce the oxygen ions into a reaction vessel without causing a contamination therein. As oxygen ions are supplied in the form of organic molecules of the source gas of the group V element and as the source gas of the group V element is supplied with much larger amount as compared with the source gas of the group III element, a large amount of oxygen ions can be incorporated into the reaction vessel and hence into the epitaxial layer. It should be noted that the oxygen atoms are released only after the organic molecules are introduced into the reaction vessel and decomposed in the vicinity of the substrate. Further, the oxygen atoms thus released are immediately combined with the atoms of the group III element such as Al that are released also in the vicinity of the substrate. Therefore, oxygen is incorporated into the crystal structure of the epitaxial layer in the form of oxygen ions without being adsorbed on the wall of the reaction vessel or piping system substantially. As the contamination of the apparatus is minimized as such, the process of the present invention can be used for the fabrication process of semiconductor devices that includes a number of epitaxial processes conducted consecutively in the same deposition apparatus. In the preferred embodiments, the organic molecule of the group V element that contains oxygen is selected from a group essentially consisting of tertiary buthoxy arsine, monoethoxy arsine, monophenoxy arsine, monomethoxy arsine, ditertiary buthoxy arsine, diethoxy arsine, diphenoxy arsine, dimethoxy arsine, tritertiary buthoxy arsine, triethoxy arsine, triphenoxy arsine and trimethoxy arsine.

Another object of the present invention is to provide a compound semiconductor device having an improved device isolation.

Another object of the present invention is to provide a compound semiconductor device that has a buffer layer of a group III–V compound semiconductor material that is doped with oxygen ions to a concentration level of oxygen exceeding $1\times10^{19}$ cm$^{-3}$. According to the present invention, the penetration of the electric field of one device into the region of another device is effectively interrupted by the oxygen ions in the buffer layer, as the electric charge of the oxygen ions intercepts the electric flux line associated with the electric field. Further, oxygen ions form a deep impurity level in the group III–V compound semiconductor material and the buffer layer thus formed shows a large resistivity. Therefore, the buffer layer acts as an effective barrier for the penetration of both the electric field and the carriers, and an excellent device isolation can be achieved.

Another object of the present invention is to provide a semiconductor device that has a buffer layer of a group III–V compound semiconductor material that is doped with oxygen, wherein the surface morphology of the device is improved.

Other objects and further features of the present invention will become apparent from the following detailed description of preferred embodiments when read in conjunction with the attached drawings.

BRIEF DESCRIPTION OF THE DRAWINGS

FIG. 3 is a diagram showing the FTNMR spectrum of the organic source of the group V element that is used in the epitaxial process of the present invention;

FIG. 5 is a diagram showing the result of the SIMS analysis for the epitaxial structure obtained in the first embodiment of the present invention;

BEST MODE FOR CARRYING OUT THE INVENTION

Hereinafter, a first embodiment of the present invention will be described.

In the first embodiment, an epitaxial layer of oxygen-containing AlGaAs is grown by an MOCVD process that employs organic gases for the source of the group III and group V elements. As usual in the MOCVD process, organic source materials such as TMG (trimethyl gallium) and TMA (trimethyl aluminum) are introduced into a reaction vessel in which a substrate of a compound semiconductor material such as GaAs is supported, together with arsine ($AsH_3$) that acts as a source of As. As a result of the pyrolysis of the organic molecules, the elements such as Al and Ga are released and deposited on the suitable site of the GaAs crystal that forms the substrate together with As that is released by the pyrolysis of arsine.

In order to form the AlGaAs layer to have a high resistivity and high concentration of oxygen ions, the present invention employs tertiary buthoxy arsine (tBOAs; $C_4H_9OAsH_2$) as another organic source of As. As will be described detail in later, the tertiary buthoxy arsine is usually used concurrently with arsine, although tBOAs may be used alone.

FIG. 3 shows the FTNMR (Fourier transform nuclear magnetic resonance) spectrum of the tBOAs molecule that is used in the present embodiment. The material of tBOAs is produced from $AsCl_3$ and is available from FURUKAWA Co. Ltd, Tokyo as "tertiary buthyl arsine." From the FTNMR spectrum of FIG. 3 that was obtained based upon the optical resonance for the group containing H, this material was found to be a mixture of usual tertiary buthyl arsine (tBA; $(CH_3)_3CAsH_2$) and tBOAs.

More specifically, FIG. 3 shows a number of peaks attributed to the $CH_3$ group, $CH_2$ group and the $AsH_2$ group that are pertinent to tBA. In addition, one can observe a slope represented by the broken line at the base part of the peak of the $CH_3$ group. Such a shift occurs in correspondence to the existence of O that is combined with the $CH_3$ group. In other words, the result of FIG. 3 clearly indicates the existence of the buthoxy group ($C_4H_9O$) in the molecule of the material. About the identification of the FTNMR spectrum, see for example A. YAMAZAKI, "Kakujiki-kyoumei-bunnkouhou" (Nuclear Magnetic Resonance Spectroscopy), Kyoritsu Publishing KK, Tokyo, 1984 (in Japanese), which is incorporated herein as reference.

Figure 1:
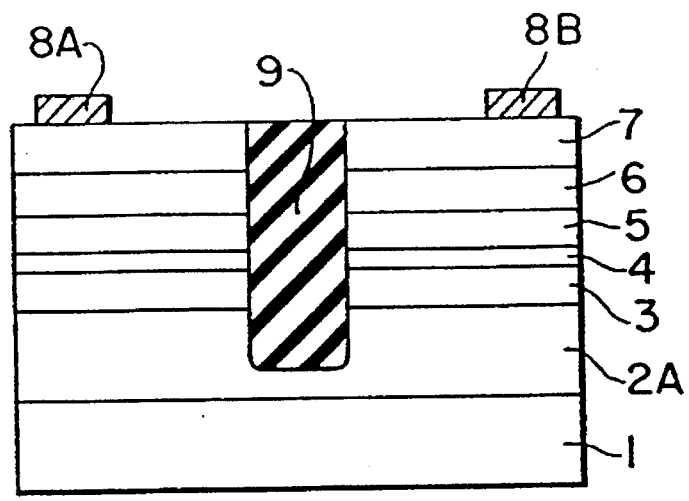
FIG. 1 is a diagram showing the structure of a conventional HEMT integrated circuit that uses a conventional buffer layer and a device isolation structure.
Figure 2:
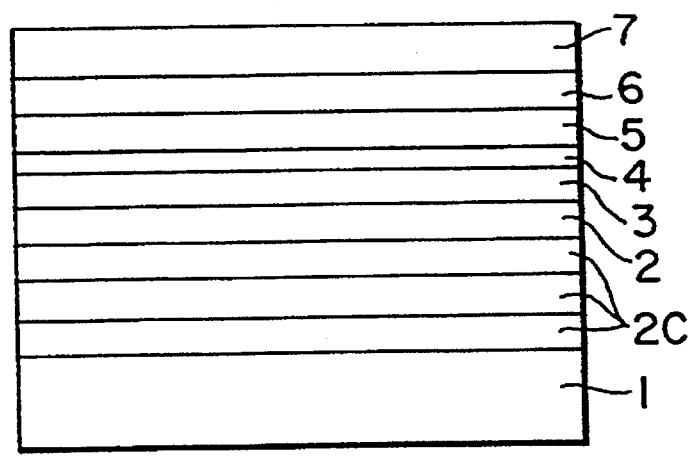
FIG. 2 is a diagram showing the structure of a layered body including a buffer layer used conventionally for fabricating a HEMT integrated circuit.
Figures 4A, 4B, 4C:
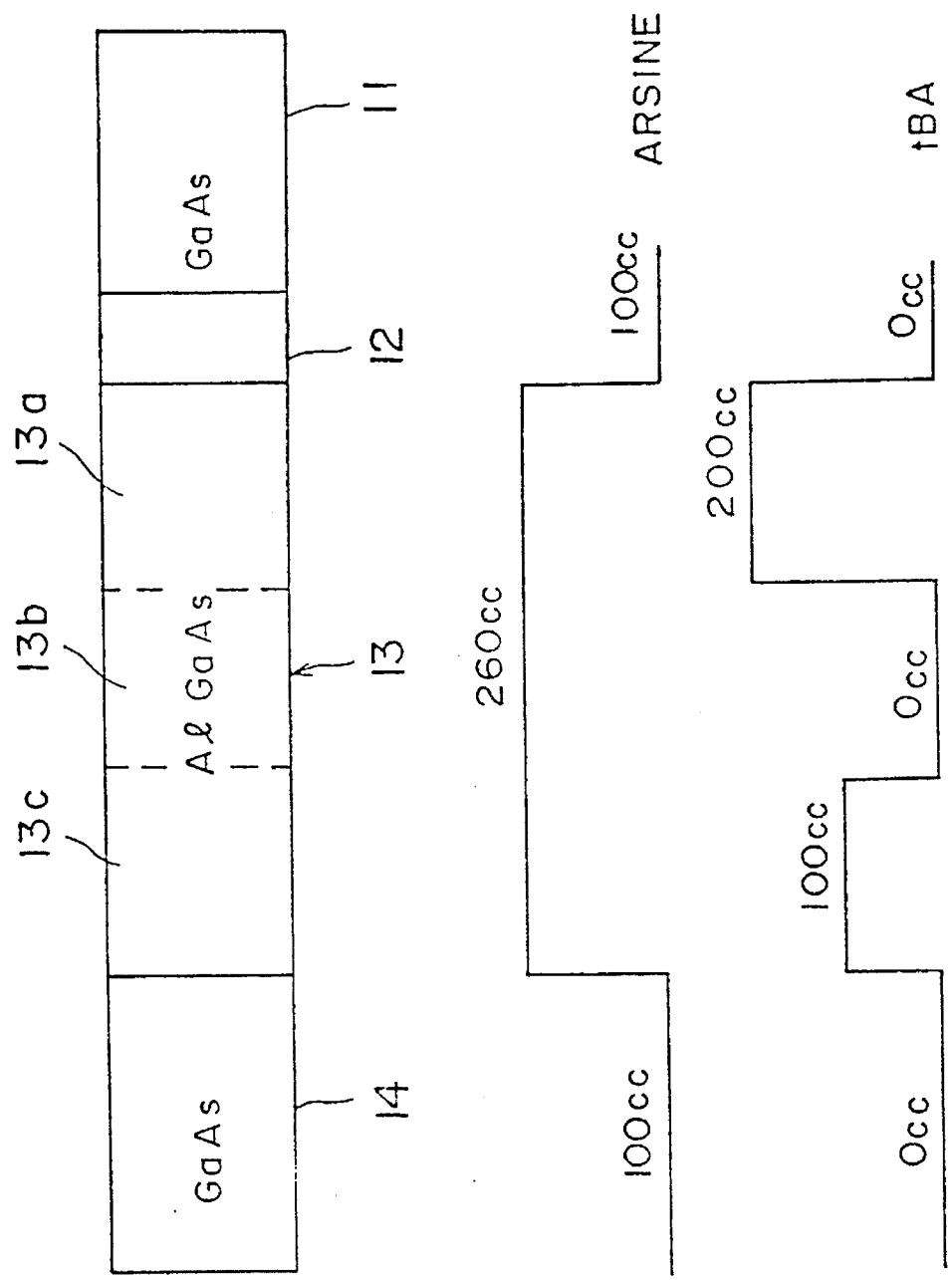
FIGS. 4(A)–4(C) are diagrams showing the process for growing an epitaxial structure of group III–V compound semiconductor materials according to a first embodiment of the present invention.

FIGS. 4(A)–4(C) are diagrams showing the process for growing the AlGaAs layer in the present embodiment, wherein FIG. 4(A) shows the epitaxial structure while FIGS. 4(B) and 4(C) show the flowrate profile of arsine and tBOAs used during the growth of the structure of FIG. 4(A).

Referring to FIG. 4(A), the epitaxial growth is made on a GaAs substrate 11 that is held in a reaction vessel (not shown) under the ordinary pressure condition at a temperature of 630° C. First, a GaAs layer 12 is grown on the substrate 11 while flowing arsine alone for the source of As. More specifically, an arsine gas diluted to 18% by a $H_2$ carrier is supplied with a flowrate of 100 cc/minute. Simultaneously, TMG is supplied by bubbling a TMG liquid held at a temperature of −4° C. and a pressure of 59 Torr by a $H_2$ carrier gas with the flowrate of 34.1 cc/min. Thereby, the GaAs layer 12 is grown with a suitable thickness such as 2000 Å.

After the GaAs layer 12 is thus formed, the growth of an AlGaAs layer 13 on the GaAs layer 12 is started. In this process, the flow rate of arsine is increased to 260 cc/min and the supply of tBOAs is started simultaneously. The source of tBOAs is a liquid and is held at a temperature of 10° C. and a pressure of 96 Torr. The supply of tBOAs is achieved by bubbling the foregoing liquid source by a hydrogen carrier with the flowrate of 200 cc/min. As already noted, tBOAs contains oxygen in the molecule.

Simultaneously to the supply of arsine and tBOAs, TMG and TMA (trimethyl aluminum) are supplied respectively as the source of Ga and Al. There, the source liquids of TMG and TMA are held at 3° C., 80 Torr and at 18° C., 7.4 Torr respectively, and the vapor of TMG and the vapor of TMA are supplied respectively to the reaction vessel with the flowrates of 16 cc/minute and 12.8 cc/minute by the bubbling the liquid sources by $H_2$. This procedure is continued for about 10 minutes and a first part 13a of the layer 13 is formed with a thickness of about 2000 Å. As will be described later with reference to FIG. 5, the layer part 13a thus formed contains substantial amount of oxygen.

Next, in order to examine the reduced contamination of the apparatus by the use of tBOAs, the supply of the tBOAs is shut down for a moment and the growth of the AlGaAs layer 13 is continued under the same condition. Thereby, a second part 13B of the layer 13 is grown with a thickness of about 2000 Å. As will be discussed detail in later, such a shut-down of the supply of tBOAs would result in a growth of AlGaAs layer that is substantially free from oxygen when there is no contamination. On the other hand, when there remains substantial amount of oxygen as a result of contamination, the layer part 13B would contain substantial amount of oxygen.

After the second layer part 13B is formed, the supply of tBOAs is resumed with the flow rate of 100 cc/minute and a third layer part 13C is formed on the second layer part 13B with a thickness of about 2000 Å. Thereby, the formation of the layer 13 is completed. Further, after the layer 13 is thus formed, the supply of tBOAs is shut down and a GaAs layer 14 is grown on the layer 13 while flowing arsine alone as the source of As with the flowrate of 100 cc/minute. During the growth of the layer 14, TMG is supplied concurrently with the same condition as in the case of growing the GaAs layer 12.

FIG. 5 shows the result of the SIMS (secondary ion mass spectroscopy) analysis conducted on the epitaxial structure obtained according to the foregoing process, wherein the drawing shows the concentration of the elements such as Ga, Al and O along a vertical path extending from the surface of the epitaxial structure toward the substrate 11. FIG. 5 also shows the profile of C and Cl contained in the structure. As the concentration of these elements is not significant, the effect of these elements will not be discussed in the description below.

Referring to FIG. 5, it will be seen that the concentration level of Ga is substantially constant throughout the structure, while the concentration level of Al increases steeply in correspondence to the AlGaAs layer 13. Further, the concentration level of O changes in correspondence to the layer parts 13A, 13B and 13C such that the concentration level exceeds far above $10^{19}$ cm$^{-3}$ in the layer parts 13A or 13C. In fact, the concentration level of O exceeds $4\times10^{19}$ cm$^{-3}$ in the layer part 13C, while the concentration level reaches almost $10^{20}$ cm$^{-3}$ in the layer part 13A. Thereby, the layers 13A and 13C show a high resistivity associated with the existence of the deep impurity level of oxygen. Oxygen thus observed is believed to be incorporated into the crystal structure of AlGaAs and exist in the form of oxygen ions.

In FIG. 5, it should be noted that the concentration level of oxygen in the layer part 13B remains well below $10^{19}$ cm$^{-3}$. More specifically, the oxygen concentration level of the part 13B is about $3\times10^{18}$ cm$^{-3}$ that is about one tenth of the oxygen concentration level in the layer part 13C. Further, it should be noted that the concentration level of oxygen in the GaAs layer 14 that is grown on the oxygen-containing AlGaAs layer 13c is substantially the same as the oxygen concentration level of the GaAs layer 12 which was formed prior to the growth of the layer 13.

The result of FIG. 5 clearly indicates that the contamination of oxygen is not significant when oxygen is introduced in the form of gaseous organic molecule of As such as tBOAs. This also indicates that molecules of tBOAs are stable during the transportation to the reaction vessel and oxygen does not contaminate the piping system or the wall of the reaction chamber. Another remarkable feature of the present embodiment is that the layers 13a and 13c contain oxygen with an amount that is much larger than the conventional epitaxial layer formed from the organic source such as trimethoxy gallium or trimethoxy aluminum. Obviously, this increased oxygen content is the result of increased flowrate of tBOAs as compared with trimethoxy gallium or trimethoxy aluminum.

Figure 6:
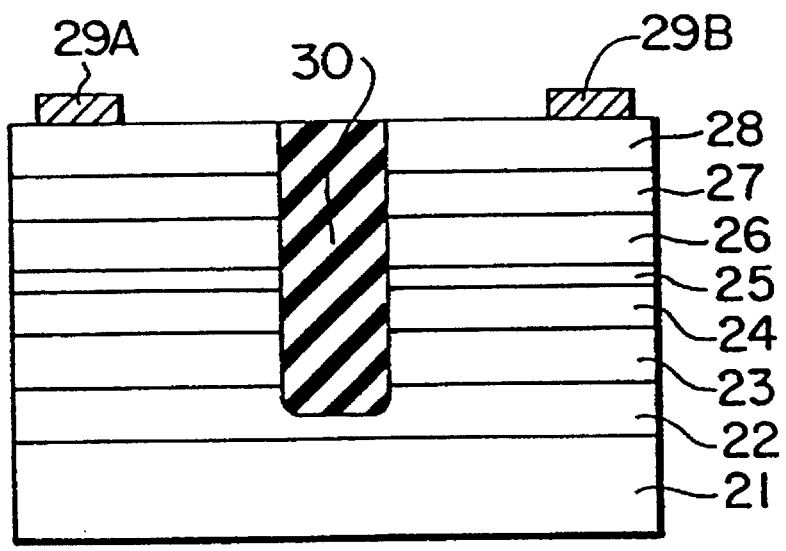
FIG. 6 is a diagram showing the structure of a HEMT that is formed on the epitaxial structure produced by the first embodiment process of the present invention.

FIG. 6 shows the structure of a HEMT formed on an epitaxial structure that includes the foregoing oxygen-containing AlGaAs buffer layer.

Referring to FIG. 6, the device is constructed on a GaAs substrate 21, and a first buffer layer 22 of GaAs corresponding to the layer 12 of FIG. 4(A) is grown on the substrate 21. Further, a second buffer layer 23 corresponding to the buffer layer 13 of FIG. 4(A) is grown on the first buffer layer 22. On the second buffer layer, a channel layer 24 of GaAs, a spacer layer 25 of undoped AlGaAs, an electron supplying layer 26 of n-type AlGaAs, a cap layer 27 of n-type GaAs, and another cap layer 28 that actually consists of a layered body of n-type GaAs and n-type AlGaAs are provided as usual. Further, gate electrodes 29A and 29B are provided on the layer 28 in correspondence to respective device regions, and a device isolation region 30 is formed between the adjacent device regions by an ion implantation of oxygen such that the region 30 reaches the buffer layer 22.

In such a device structure, the devices are isolated laterally by the device isolation region 30. Further, the penetration of carriers as well as the penetration of the electric field through the barrier layer is effectively prevented by the buffer layer 23 that incorporates therein fixed electric charges in the form of oxygen ions. As already noted, such oxygen ions not only cause the pinning of the Fermi level but also act as a shield of the electric field.

Next, the effect of the device isolation achieved by the buffer layer thus formed by the present invention will be described in detail with reference to FIGS. 7 and 8 that show a second embodiment of the present invention.

Figure 7:
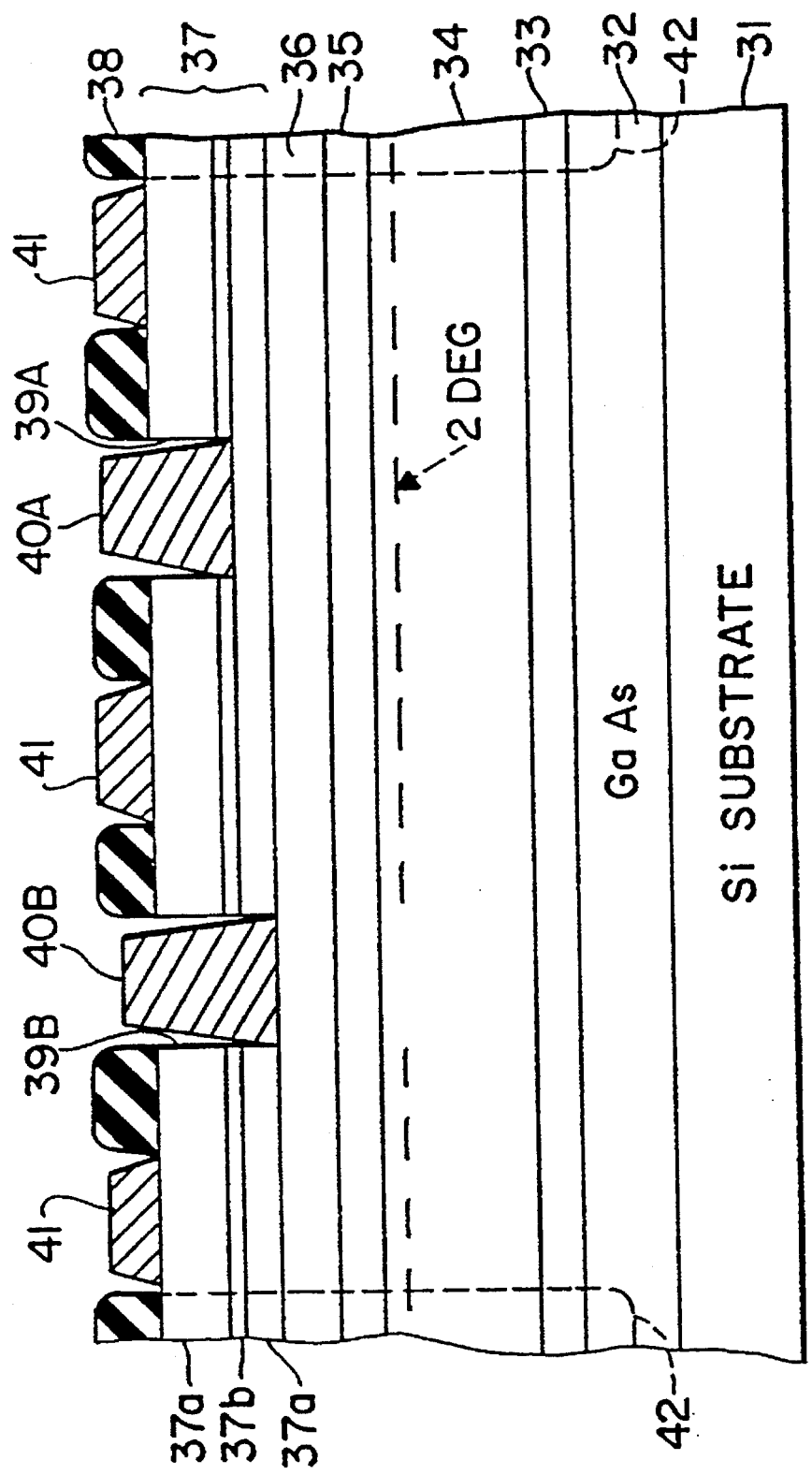
FIG. 7 is a diagram showing the structure of another HEMT according to a second embodiment of the present invention.

FIG. 7 shows a part of a HEMT integrated circuit that includes a number of device regions each of which includes an E-mode HEMT and a D-mode HEMT. In the present embodiment, the integrated circuit is constructed on a silicon substrate 31.

On the upper major surface of the silicon substrate 31, there is provided a first buffer layer 32 of undoped GaAs with a thickness of 3 μm. As is commonly practiced in the art, the GaAs buffer layer 32 is grown on the silicon substrate 31 as an amorphous phase and crystallized subsequently upon subsequent deposition of crystal layers thereon.

On the upper major surface of the buffer layer 32, a second buffer layer 33 corresponding to the buffer layer 13 is provided with a thickness of 6000 Å. The buffer layer 33 is grown by using tBOAs under the condition that is the same as the condition used for growing the layer 13a of FIG. 4(A). Further, a channel layer 34 of undoped GaAs is provided on the buffer layer 33 with a thickness of about 3000 Å, and an electron supplying layer 36 of n-type AlGaAs is provided on the channel layer 34 with a thickness of about 370 Å, with a spacer layer 35 of undoped AlGaAs interposed between the layers 34 and 36 with a thickness of 10 Å as usual. On the electron supplying layer 36, a processing layer 37 that in turn includes an alternate deposition of an n-type GaAs layer 37a and an n-type AlGaAs layer 37b, is provided with a total thickness of about 1000 Å. On the processing layer 37, an insulation layer 38 of silicon oxide is provided.

Further, grooves 39A and 39B are formed on the processing layer 37 respectively in correspondence to the E-mode HEMT and the D-mode HEMT such that the groove 39A for the E-mode HEMT exposes the upper major surface of the GaAs layer 37a that is grown immediately above the electron supplying layer 36, and a Schottky electrode 40A is provided in contact with the exposed upper major surface of the layer 37a as a gate of the E-mode HEMT with a gate length of 0.5 μm. The groove 39B on the other hand is provided to extend through the entire thickness of the layer 37 and exposes the upper major surface of the electron supplying layer 36. Further, another Schottky electrode 40B is provided in correspondence to the groove 39B on the exposed upper major surface of the layer 36 as a gate of the D-mode HEMT with a gate length of 0.5 μm. Further, the silicon oxide layer 38 is patterned in correspondence to the source and drain of the device to expose the upper major surface of the layer 37, and ohmic electrodes 41 are provided on the exposed surface of the layer 37 as the source and drain electrodes of the HEMT. After the individual devices are formed as such, an ion implantation process of oxygen is conducted to form a device isolation region 42 in correspondence to the boundary between adjacent device regions such that the device isolation region 42 reaches the buffer layer 32, and the fabrication of the HEMT integrated circuit is completed.

Figure 8:
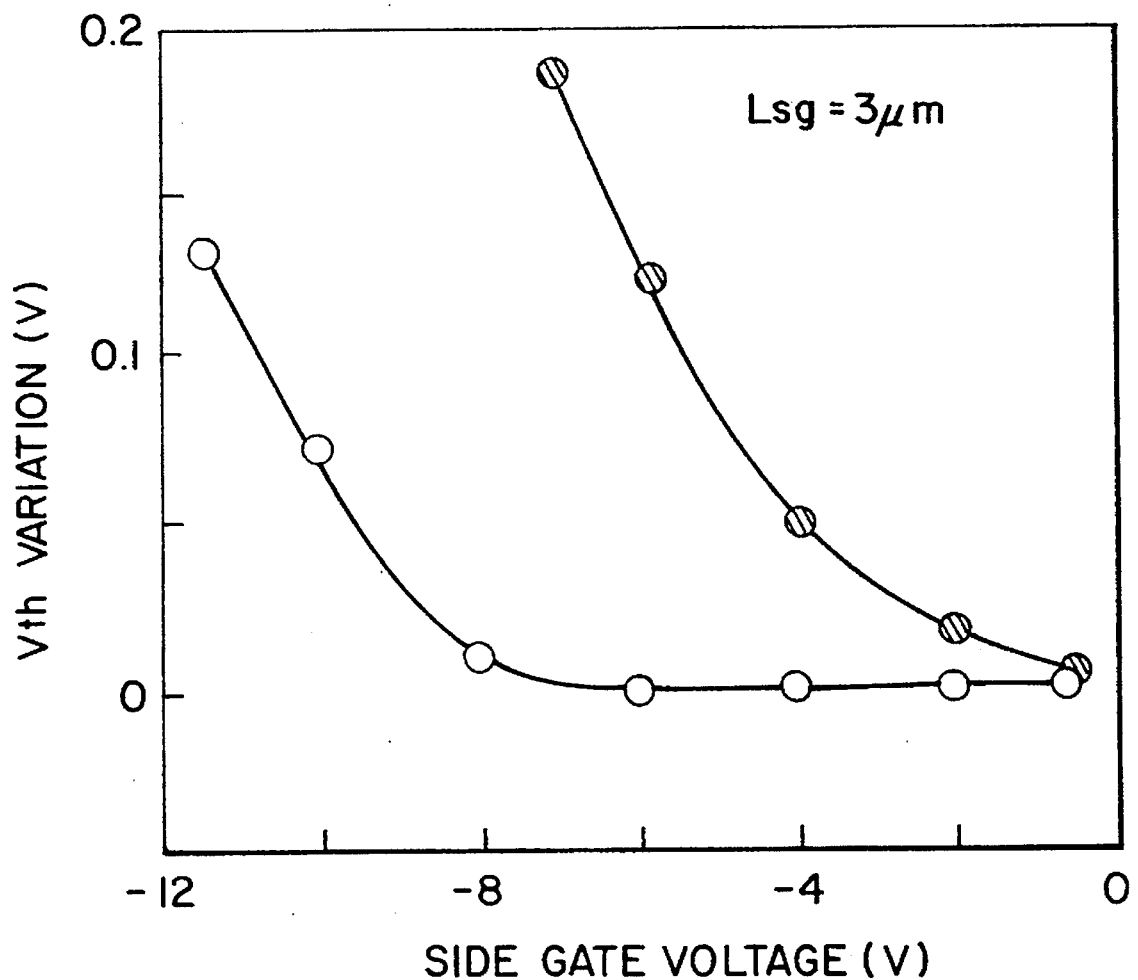
FIG. 8 is a diagram showing the suppression of the side gate effect that is achieved in the device of the second embodiment in comparison with a conventional device.

FIG. 8 shows the shift of the threshold voltage $V_{TH}$ of the D-mode HEMT of FIG. 7 in response to the application of a side gate voltage to another D-mode HEMT in the adjacent device region. In FIG. 8, the result for the device of FIG. 7 is represented by the open circles. In this measurement, the gates of the devices were separated from each other by a distance of 3 μm ($L_{sg}$=3 μm) across the device isolation region 42, and no voltage was applied to the gates of the E-mode HEMTs. For the sake of comparison, the result of similar measurement for the HEMT integrated circuit that has an identical structure except for the buffer layer 33 is represented by the solid circles.

As can be seen clearly from FIG. 8, the device of the present embodiment can suppress the side gate effect even when a side gate voltage as large as −8 volts is applied to the adjacent device. On the other hand, the conventional device shows a conspicuous side gate effect even when the side gate voltage of −1 volt is applied. The device thus constructed showed the K factor of 293 mA/V/mm$^2$ and the transconductance $g_m$ of 241 mS/mm.

Figure 9:
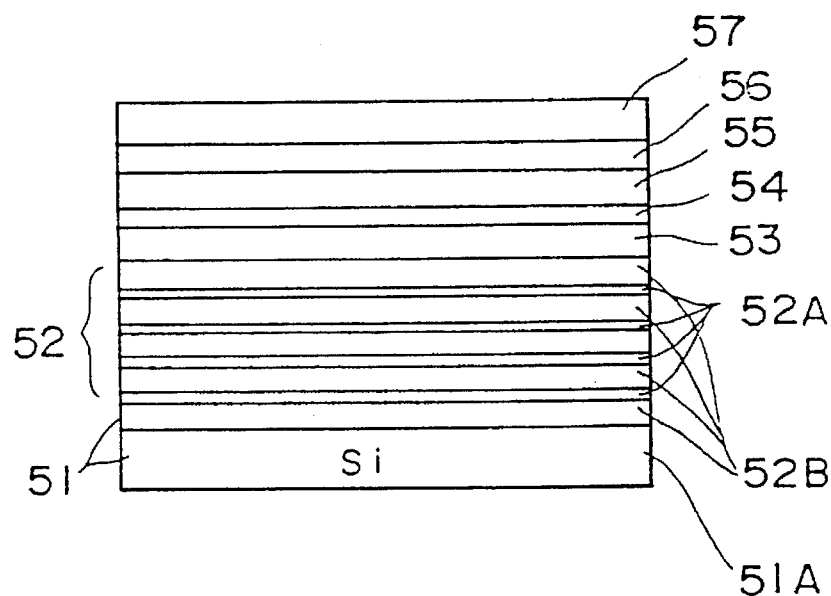
FIG. 9 is a diagram showing an epitaxial structure produced according to a third embodiment of the present invention.

FIG. 9 shows a third embodiment for growing a buffer layer containing fixed electric charges on a silicon substrate 51. It should be noted that the silicon substrate 51 includes a strained superlattice structure 51b formed on the upper major surface a silicon substrate 51a for facilitating the growth of compound semiconductor layer.

Referring to FIG. 9, a first buffer layer 52a of oxygen-containing AlGaAs is provided on the (100) oriented surface of the superlattice layer 51b with a thickness of 20 nm, and a second buffer layer 52b of high purity AlGaAs is grown on the first buffer layer 52a with a thickness of about 200 nm. Such an alternate growth of the first and second buffer layers 52a and 52b are repeated for example for three times.

In growing the buffer layers 52a and 52b, tBOAs is used together with arsine for the source of the layer 52a similarly to the first embodiment. When growing the layers 52a and 52b alternately, a thermal cycling process is employed for relaxing the stress that is accumulated in these layers due to the large difference in the lattice constant and thermal expansion between AlGaAs and silicon.

Figure 10:
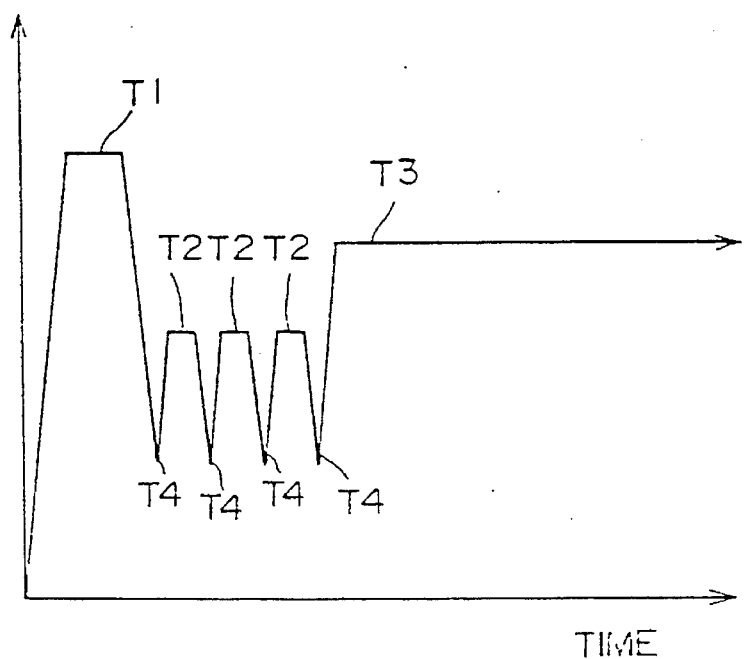
FIG. 10 is a diagram showing the fabrication process of the structure of FIG. 9.

FIG. 10 shows the thermal cycling process that is conducted in a single reaction vessel for the growth of the epitaxial layers 52–57. Referring to FIG. 10, the substrate 51 includes therein the silicon substrate 51a and the strained superlattice layer 51b, and is baked at a high temperature $T_1$ such as 1000° C. at the beginning of the epitaxial process to remove any oxide film or contamination from the surface of the layer 51b. Next, the temperature is lowered to a temperature $T_4$ such as 300° C. and raised again to a temperature $T_2$ that is set to about 600° C. At this temperature, the buffer layers 52a and 52b at the first level are grown consecutively. Next, the temperature is lowered to $T_4$ and raised again to $T_2$, and the growth of the layers 52a and 52b for the second level is achieved. Further, the temperature is lowered to $T_4$ and raised again to $T_2$ and the growth of the layers 52a and 52b for the third level is achieved. It should be noted that the foregoing thermal cycling is achieved in the same reaction vessel, without taking the substrate therefrom.

By applying the foregoing thermal cycling process, the stress in the layers 52a and 52b is relaxed as already noted, and such a relaxation of the stress results in an improved surface roughness of the buffer layer 52 as well as the reduced defect concentration level in the layers grown on the layer 52. After the buffer layer 52 is formed, a channel layer 53 corresponding to the channel layer 34 of FIG. 7, a spacer layer 54 corresponding to the spacer layer 35, an electron supplying layer 55 corresponding to the electron supplying layer 35, and a cap layer 57 corresponding to the cap layer 37, are grown consecutively according to the usual process.

In the present embodiment, the barrier structure 52 contains the fixed electric charges therein and can block the carriers that are released from various surface states and impurity states formed on the exposed surface of the substrate 51. Therefore, the operation of the semiconductor devices formed in the epitaxial layers 53–57 is substantially stabilized. In other words, the influence of the free surface of the substrate on the device performance can be minimized by providing the buffer layer 52 on the free surface of the substrate 51.

It should be noted that the above principle can be applicable also for the fabrication process of semiconductor devices that includes an interruption of the crystal growth. When the crystal growth is interrupted, for example for the purpose of photolithographic process and the like, the formation of adversary surface states is generally inevitable. By growing the buffer layer containing oxygen ions in the crystal when resuming the epitaxial process, the effect of the surface states can be effectively shielded.

It should be noted that the foregoing alternate and repetitive growth of the oxygen-containing AlGaAs buffer layer 52a and the high purity AlGaAs buffer layer 52b improves the surface morphology or surface roughness of the buffer layer 52 and hence the quality of the channel layer 53 that is grown directly on the layer 52. Without such an alternate and repetitive deposition of the high purity layer and the doped layer, there is a tendency that the surface morphology becomes rough with increasing dose of the dopant. It is believed that such a degradation of the surface morphology is caused by the stress induced in the epitaxial layer by the dopant.

The foregoing alternate stacking of the oxygen-containing AlGaAs buffer layer 52a and the high purity AlGaAs buffer layer 52b successfully eliminates the problem of degradation of the surface morphology. In one example, a measurement of the surface roughness was made for an epitaxial structure that is essentially identical with the structure of FIG. 9.

In this experiment, a buffer layer corresponding to the layer 52 was formed on a semi-insulating GaAs substrate corresponding to the substrate 51 of FIG. 7 by an alternate repetition of a high purity GaAs layer and an oxygen-containing AlGaAs layer with the total thickness of the GaAs layer of 20 nm and the total thickness of the AlGaAs layer of about 30 nm. The deposition of the GaAs and AlGaAs buffer layers was repeated three times, five times or eight times, wherein the deposition of the oxygen-containing AlGaAs layer was made under the condition similar to the first embodiment. On the buffer layer thus formed, another buffer layer of undoped GaAs was grown with a thickness of 20 nm, and a channel layer of undoped InGaAs having a composition of $In_{0.2}Ga_{0.8}As$ was grown thereon in correspondence to the channel layer 53 of FIG. 9.

On the channel layer thus formed, a spacer layer of undoped InGaP is grown with a thickness of 2 nm in correspondence to the layer 54 and an electron supplying layer of n-type InGaP is grown on the spacer layer in correspondence to the layer 55 with a thickness of 40 nm. Further, a cap layer of n-type GaAs is grown on the electron supplying layer thus grown with a thickness of 30 nm.

As a result of the measurement of the surface roughness that uses the interference of laser beam, it was found that the surface roughness of the epitaxial structure thus obtained was as small as 12 Å. This indicates that the surface of the buffer layer in the epitaxial structure is excellent and the quality of the channel layer formed thereon is also excellent.

Figure 11A:
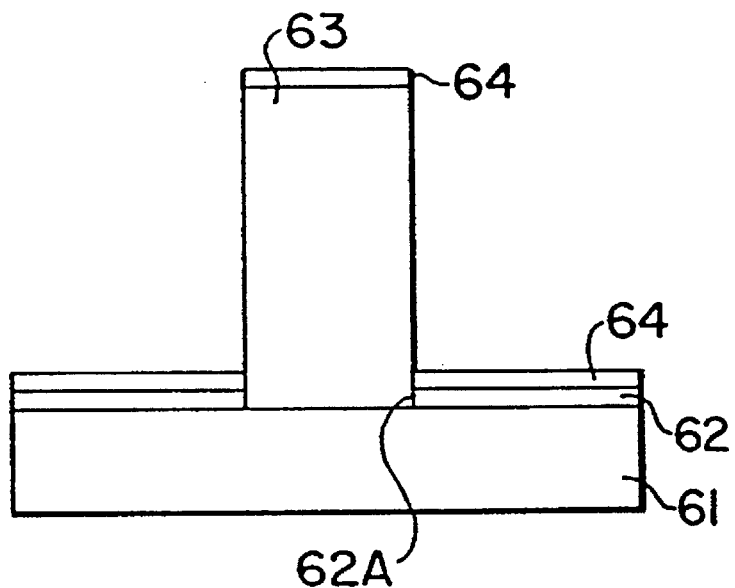
FIGS. 11(A) and 11(B) are diagrams showing a HEMT and a fabrication process thereof according to a fourth embodiment of the present invention.
Figure 11B:
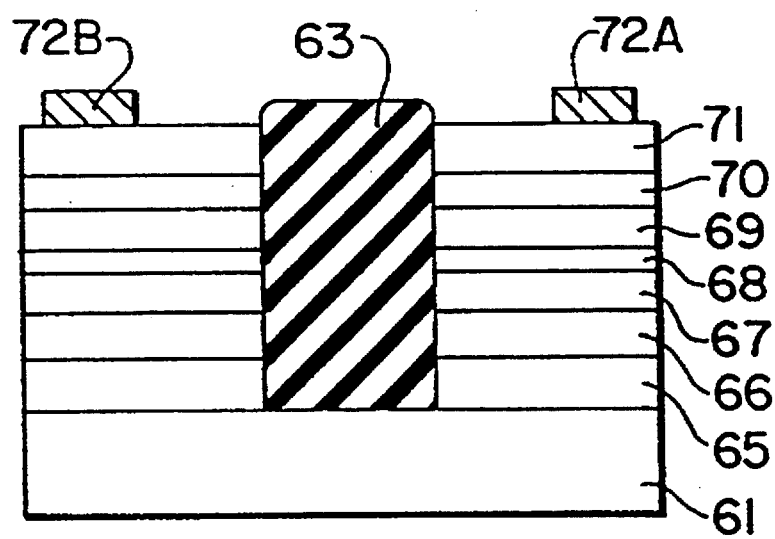

Next, a fourth embodiment of the present invention will be described with reference to FIGS. 11(A) and 11(B), wherein FIG. 11(A) shows an intermediate step of device fabrication process and FIG. 11(B) shows the structure of the device of the present embodiment.

Referring to FIG. 11(A), a SiON layer 62 is deposited on a GaAs substrate 61 and patterned to form a window 62a that exposes the upper major surface of the substrate 61. Further, by using the patterned SiON layer 62 as a mask, a layer of oxygen-containing AlGaAs layer 63 is grown selectively on the part of the substrate 61 that is exposed by the window 62a. Further, a silicon oxide layer 64 is grown on the entire upper surface of the structure thus formed. Therefore, the structure shown in FIG. 11(A) is obtained.

Next, the SiON layer 62 is dissolved in an organic solvent. Therefore, the silicon oxide layer 64 that covers the SiON layer 62 is removed altogether, and the upper major surface of the GaAs substrate 61 is exposed at both lateral sides of the layer 63 that projects upward from the substrate 61. Further, a GaAs buffer layer 65 corresponding to the buffer layer 22 of FIG. 6 is grown on the exposed upper major surface of the substrate 61 and a second buffer layer 66 of oxygen-containing AlGaAs is grown on the first buffer layer 66 in correspondence to the buffer layer 23 of FIG. 6. During this process, no epitaxial growth is made on the layer 63, as the top surface of the layer 63 is protected by the silicon oxide layer 64 that rejects the growth of III–V compound semiconductor material thereon.

On the buffer layer 66 thus formed, a channel layer 67 of undoped GaAs, a spacer layer 68 of undoped AlGaAs, an electron supplying layer 69 of n-type AlGaAs, a cap layer 70 of n-type GaAs, and another cap layer 71 of n-type AlGaAs and n-type GaAs are grown respectively in correspondence to the layers 24, 25, 26, 27 and 28 of FIG. 6. Further, Schottky electrodes 72A and 72B are provided on the upper major surface of the second cap layer 28 as a gate electrode. Therefore, a device that includes a pair of HEMTs is obtained such that the HEMTs are isolated with each other laterally by the layer 63 of oxygen-containing AlGaAs and vertically by the buffer layer 66 also of oxygen-containing AlGaAs. In other words, the present embodiment provides a process for forming the device isolation region without relying upon the ion implantation of oxygen.

Next, a fifth embodiment of the present invention will be described with reference to FIGS. 12(A)–12(D). In the present embodiment, a region that forms the active part of the device is grown on a substrate laterally at a selected location.

Figure 12A:
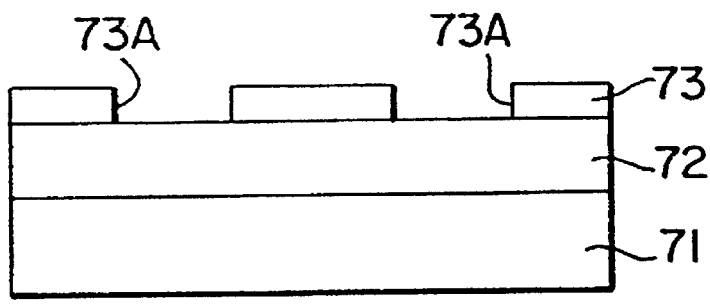
FIGS. 12(A)–12(D) are diagrams showing the fabrication process of a semiconductor structure according to a fifth embodiment of the present invention.

Referring to FIG. 12(A) first, an epitaxial layer 72 of undoped AlGaAs is grown epitaxially on a GaAs substrate 71, and a SiON layer 73 is deposited on the AlGaAs layer 72. Further, the layer 73 is patterned to form windows 73a that expose the upper major surface of the AlGaAs layer 72 in correspondence to where a selective epitaxial growth of a III–V material is to be made. For example, the windows 73a may expose a strip-like region extending in the <010> direction of AlGaAs layer 72.

Figure 12B:
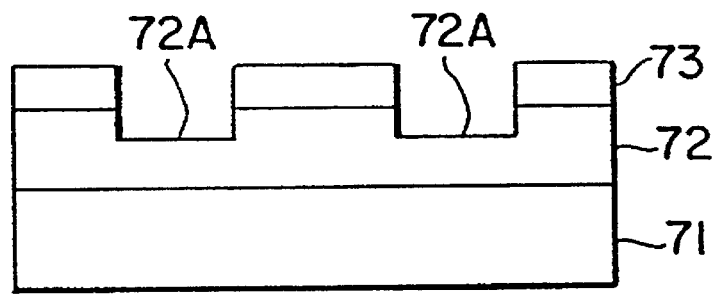

In the step of FIG. 12(B), the AlGaAs layer 72 is subjected to an RIE process while using the SiON layer 73 as a mask, and a plurality of grooves 72a are formed in correspondence to the device region such that the grooves 72a extend in the <010> direction.

Figure 12C:
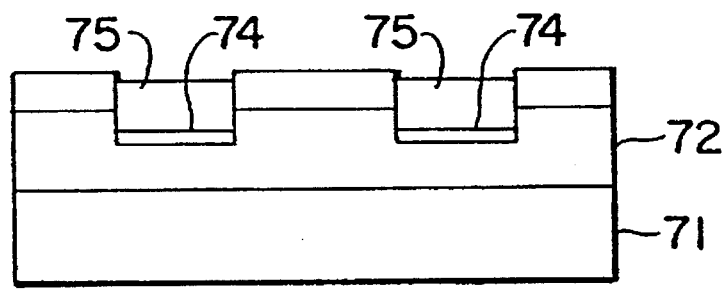
Figure 12D:
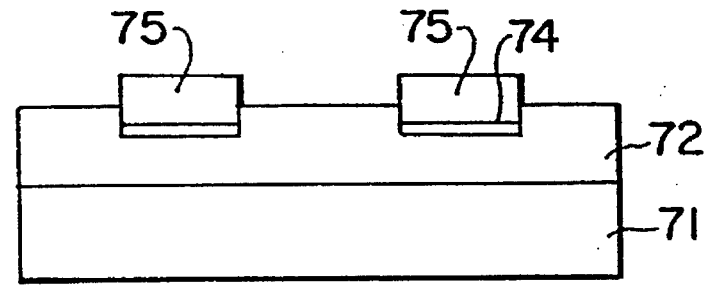

Further, in the step of FIG. 12(C), an oxygen-containing AlGaAs layer 74 is grown on the AlGaAs layer 72 in correspondence to the grooves 72a according to the process described with the first embodiment for growing the layer 13a, and an undoped GaAs layer 75 is grown on the layer 74 in correspondence to the grooves 72a such that the grooves 72a is filled by the GaAs layer 75. Further, the SiON mask layer 73 is removed and a structure shown in FIG. 12(D) is obtained. It should be noted that the GaAs layer 75 having a laterally confined width in the AlGaAs layer 72 forms a quantum well wire or box when the lateral width of the layer 75 is reduced.

Figure 13A:
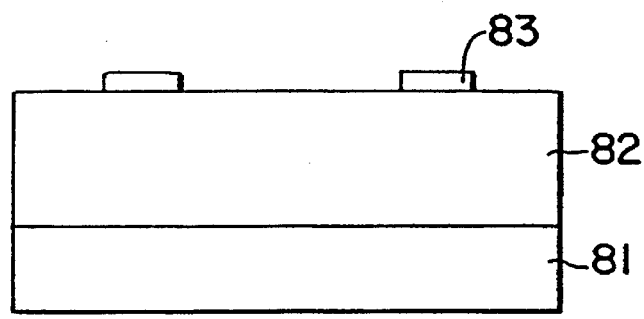
FIGS. 13(A)–13(C) are diagrams showing the fabrication process of a semiconductor structure according to a sixth embodiment of the present invention.
Figure 13B:
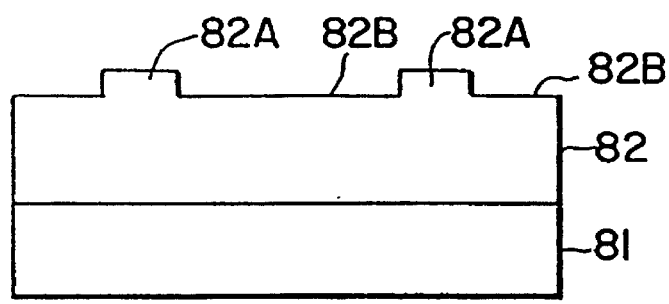
Figure 13C:
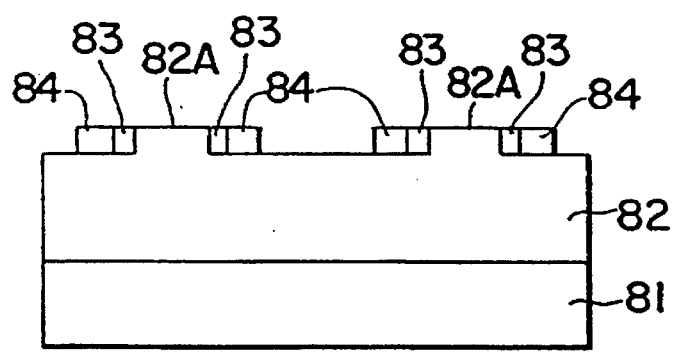

FIGS. 13(A)–13(C) show a sixth embodiment of the present invention. This embodiment is also suitable for forming a quantum well wire or a quantum well box.

Referring to FIG. 13(A), an undoped AlGaAs layer 82 is grown on a semi-insulating GaAs substrate 81 and a mask layer 83 of SiON is grown on the layer 82. The mask layer 83 is patterned subsequently to form a number of strip-like patterns extending parallel with each other on the surface of the AlGaAs layer 82 in the <010> direction.

In the step of FIG. 13(B), the surface of the layer 82 is subjected to an RIE process to form a number of grooves 82b separated with each other by projections 82a, wherein the projections 82a correspond to the mask 83 and the grooves 82b correspond to the exposed part of the surface of the layer 82.

In the step of FIG. 13(C), an oxygen-containing AlGaAs layer 82 is grown laterally along the surface of the grooves 82b such that the growth of the layer 83 starts from the step of the projections 82a, wherein the growth of the layer 83 may be achieved similarly to the growth of the layer 83 of the first embodiment. After the layer 83 is formed as such, the growth of an undoped GaAs layer 84 is achieved also along the surface of the grooves 82b, starting from the step of the layer 83. In this embodiment, one can form a quantum well wire having a reduced width without difficulty.

In the foregoing description, the growth of the oxygen-containing AlGaAs layer has been achieved by using tBOAs for the source of O and As. However, the source of O and As that can be used in the process of the present invention is not limited to tBOAs but other organic sources of As can also be used. These organic sources include: monoethoxy arsine $(C_2H_5OAsH_2)$; monophenoxy arsine $(C_6H_5OAsH_2)$; monomethoxy arsine $(CH_3OAsH_2)$; ditertiary buthoxy arsine $((C_4H_9O)_2AsH)$; diethoxy arsine $((C_2H_5O)_2AsH)$; diphenoxy arsine $((C_6H_5O)_2AsH)$; dimethoxy arsine $((CH_3O)_2AsH)$; tritertiary buthoxy arsine $((C_4H_9O)_3As)$; triethoxy arsine $((C_2H_5O)_3As)$; triphenoxy arsine $((C_6H_5O)_3As)$; and trimethoxy arsine $((CH_3O)_3As)$.

Further, the present invention is not limited to the embodiments described heretofore, but various variations and modifications may be made without departing from the scope of the invention.

INDUSTRIAL APPLICABILITY

According to the present invention, one can introduce oxygen into a reaction vessel without causing a contamination. As oxygen is supplied in the form of organic molecules of the source gas of the group V element and as the source gas of the group V element is supplied with much larger amount as compared with the source gas of the group III element, a large amount of oxygen ions can be incorporated into the reaction vessel and hence into the epitaxial layer. By using such an epitaxial layer that contains large amount of oxygen ions as the impurity for the buffer layer, one can achieve an effective device isolation.

We claim:

1. A semiconductor integrated circuit, comprising:

a substrate having upper and lower major surfaces;

a buffer layer of AlGaAs provided on said upper major surface of the substrate, said buffer layer having upper and lower major surfaces and containing oxygen with a concentration level substantially exceeding $10^{19}$ ions $cm^{-3}$, said buffer layer interrupting a flow of carriers therethrough and interrupting a passage of an electric flux line;

a device layer provided on the upper major surface of the buffer layer, said device layer having upper and lower major surfaces and formed therein with a plurality of active devices; and a device isolation region provided between adjacent active devices for isolating the active devices from each other, said device isolation region extending from the upper major surface of the active layer toward the substrate.

2. A semiconductor integrated circuit as claimed in claim 1 in which said buffer layer contains oxygen with a concentration level substantially exceeding $4 \times 10^{19}$ ions $cm^{-3}$.

3. A semiconductor integrated circuit as claimed in claim 1 in which said buffer layer contains oxygen with a concentration level of about $10^{20}$ ions $cm^{-3}$.

* * * * *

UNITED STATES PATENT AND TRADEMARK OFFICE
CERTIFICATE OF CORRECTION

PATENT NO. : 5,569,953
DATED : October 29, 1996
INVENTOR(S) : Kikkawa et al.

It is certified that error appears in the above-indentified patent and that said Letters Patent is hereby corrected as shown below:

Column 11, lines 15-16, delete "There-fore" and insert --Thus--.

Column 11, line 18, delete "Therefore" and insert --Next--.

Column 11, line 39, delete "Therefore" and insert --Thus--.

Signed and Sealed this

Twenty-ninth Day of April, 1997

Attest:

BRUCE LEHMAN

Attesting Officer

Commissioner of Patents and Trademarks